(12) United States Patent
Lai

(10) Patent No.: US 6,966,620 B2
(45) Date of Patent: Nov. 22, 2005

(54) FASTENER ASSEMBLY FOR SECURING A SIDE COVER TO A FRAME OF A COMPUTER CASE

(75) Inventor: Vincent Lai, Taoyuan Hsien (TW)

(73) Assignee: In Win Development, Inc., Taoyuan Hsien (TW)

( * ) Notice: Subject to any disclaimer, the term of this patent is extended or adjusted under 35 U.S.C. 154(b) by 74 days.

(21) Appl. No.: 10/621,517

(22) Filed: Jul. 18, 2003

(65) Prior Publication Data

US 2005/0012436 A1 Jan. 20, 2005

(51) Int. Cl.[7] ............................................. H05K 7/18
(52) U.S. Cl. ............ 312/223.3; 312/263; 292/DIG. 11
(58) Field of Search .................... 312/223.2, 257.1, 312/263, 265.5, 265.6; 174/52.1, 50, 35 R; 361/679, 683; 292/128, 101, 103, DIG. 11; 220/315, 324, 4.28, 4.31, 433; 403/322.4, 403/322.3, 322.2

(56) References Cited

U.S. PATENT DOCUMENTS

| | | | |
|---|---|---|---|
| 604,786 A * | 5/1898 | Pletcher ....................... | 292/128 |
| 1,521,572 A * | 12/1924 | Hammer et al. ............ | 292/175 |
| 1,546,986 A * | 7/1925 | Mcintosh ..................... | 292/128 |
| 5,239,444 A * | 8/1993 | Sasaki ......................... | 361/683 |
| 5,603,535 A * | 2/1997 | Antonucci et al. .......... | 292/128 |
| 5,691,503 A * | 11/1997 | Kato .......................... | 174/35 R |
| 5,751,545 A * | 5/1998 | Jung .......................... | 361/683 |
| 5,823,644 A * | 10/1998 | Suh et al. ................ | 312/223.2 |
| 5,967,633 A * | 10/1999 | Jung ....................... | 312/223.2 |
| 5,995,363 A * | 11/1999 | Wu ............................ | 361/679 |
| 6,362,975 B1 * | 3/2002 | Liu et al. .................... | 361/796 |
| 6,527,309 B1 * | 3/2003 | Gaydos et al. ............. | 292/128 |
| 6,666,484 B1 * | 12/2003 | Branch et al. ............. | 292/128 |
| 6,721,183 B1 * | 4/2004 | Chen et al. ................ | 361/726 |

\* cited by examiner

Primary Examiner—Janet M. Wilkens
(74) Attorney, Agent, or Firm—Bacon & Thomas PLLC

(57) ABSTRACT

A side cover is secured to a frame of a computer case by a clamp including a clamping piece and a clamp socket which engage within corresponding holes provided in the frame and side cover to secure the side cover to the frame without requiring conventional fasteners.

1 Claim, 4 Drawing Sheets

FASTENER ASSEMBLY FOR SECURING A SIDE COVER TO A FRAME OF A COMPUTER CASE

BACKGROUND OF THE INVENTION

1) Field of the Invention

The present invention relates to a new type of fastener for computer case side covers, more specifically a fastener which secures the computer case side covers through use of a clamp mechanism. Said clamp mechanism enables the computer case side covers to be attached fast and convenient to the computer case.

2) Description of the Prior Art

The present invention relates to a new type of fastener for the computer case side covers which no longer uses screws or bolts to secure the computer case side covers but attaches these side covers through clamp fasteners onto the computer case.

Referring to FIG. 1 on this picture you see a traditional computer case 10, with a computer case frame 100 attached to a front panel 200, a top cover 300 and two side covers 400 to encase the inner parts of the computer and thus forming the complete computer case 10. Both side covers 400 are secured by using screws A to attach the side covers 400 through the screw holes 401 to the screw holes 101 on the computer case frame 100. Such a structure still has a number of weaknesses:
1. Too much manual force needed to attach the side cover.
2. It's time-wasting to attach the side cover.
3. Tools like a screw driver are needed.
4. In mass production, the cases can not be assembled fast enough.
5. It's time-consuming and laborious during maintenance.

SUMMARY OF THE INVENTION

The objective of the present invention is to provide a new fastener for computer case side covers, which can attach both side covers through a fast and convenient clamp fastening mechanism, thus reducing the time and labor needed for assembly or maintenance, thus further improving the commercial value of the present structure.

To enable a further understanding of the said objectives and the technological methods of the invention herein, the brief description of the drawings below is followed by the detailed description of the preferred embodiments.

DETAILED DESCRIPTION OF THE PREFERRED EMBODIMENT

Figure 1:
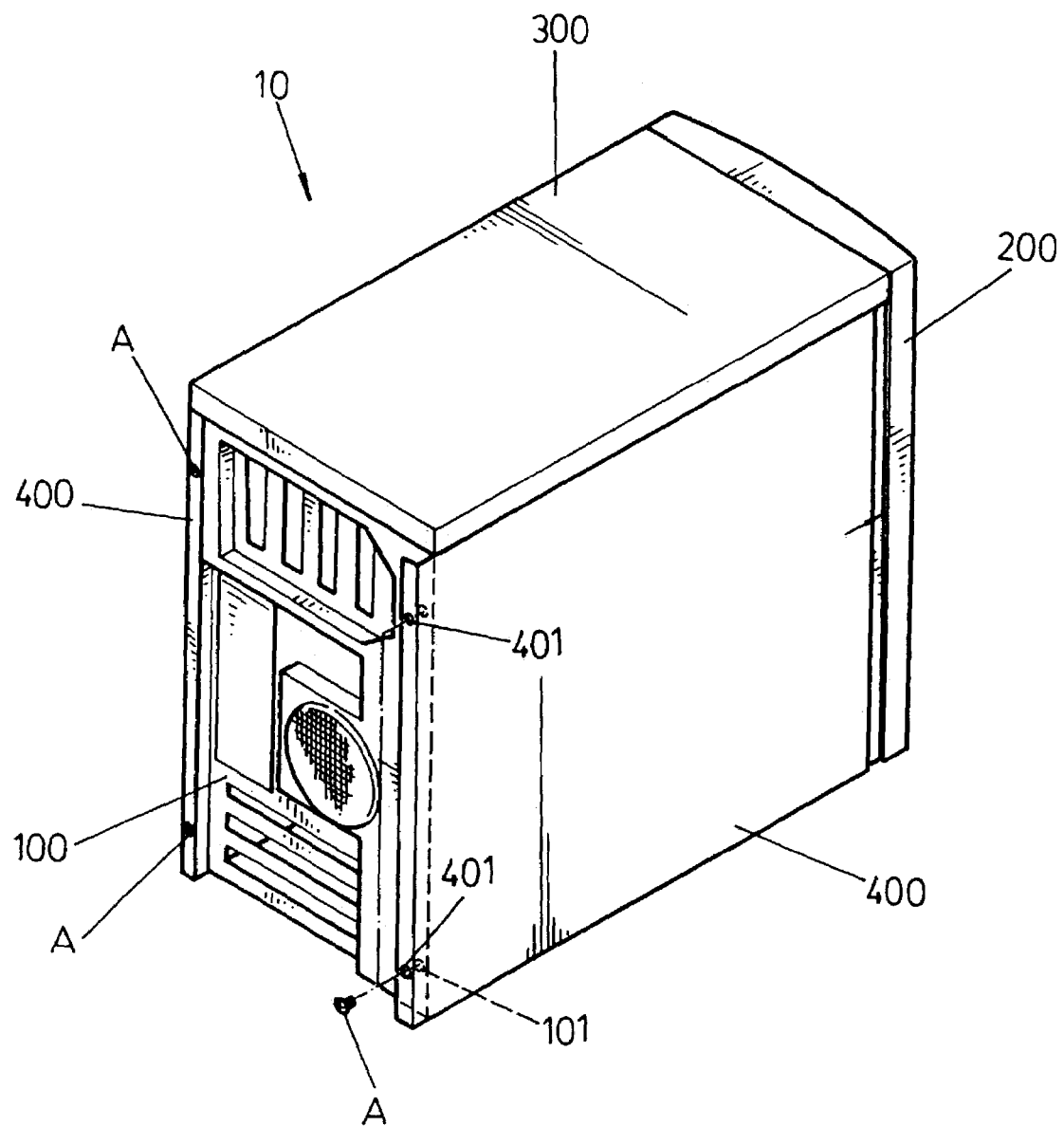
FIG. 1 is a drawing of the complete structure of a traditional computer case.
Figure 2:
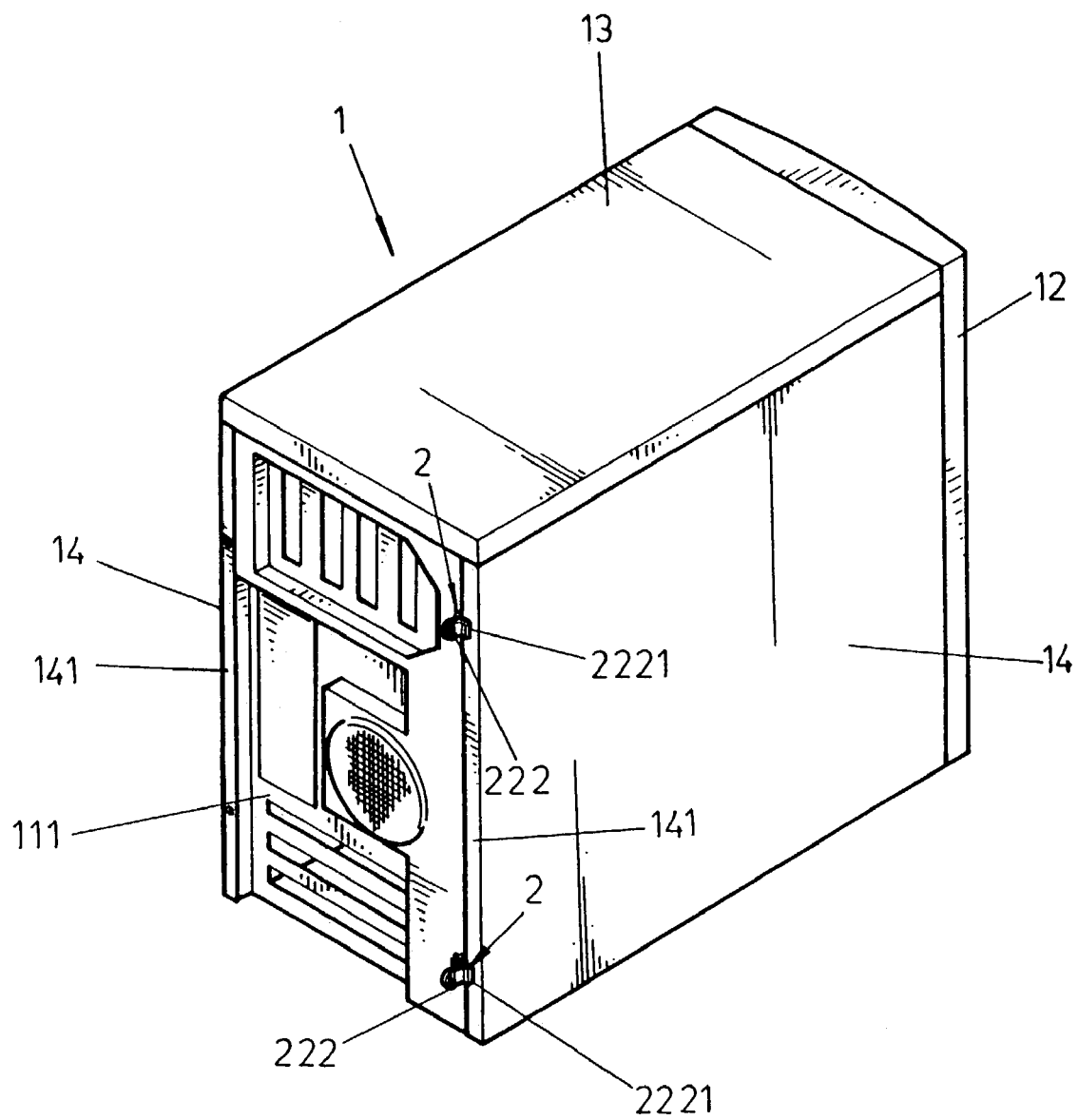
FIG. 2 is a perspective drawing of the complete structure of the computer case according to the present invention.
Figure 3:
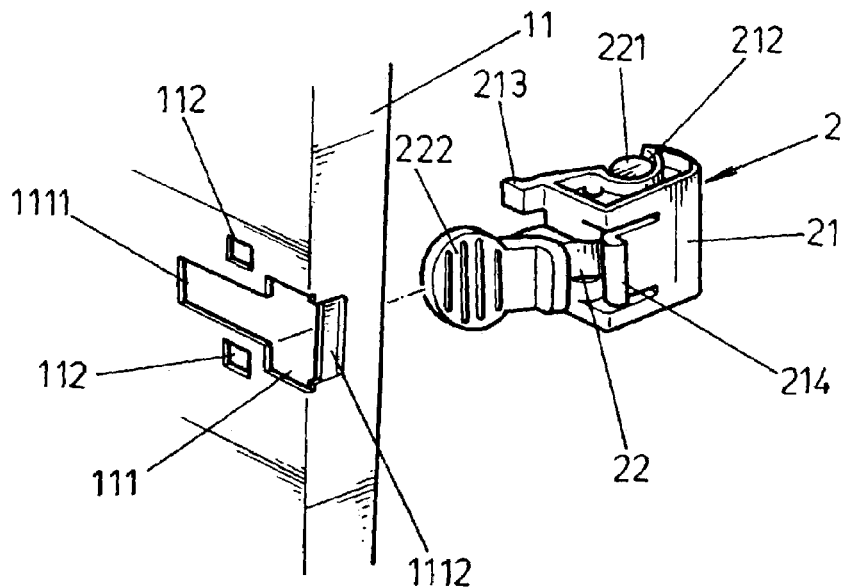
FIG. 3 is a schematic exploded drawing of the fastening mechanism according the present invention.

Referring to FIG. 2 to FIG. 3, the present invention comprises a computer case 1, having a computer case frame 11, attached to a front panel 12, a top cover 13 and two side covers 14, further including the following attributes:

Both side covers 14 make use of one upper and one lower clamp 2 to attach the side covers 14 to the computer case frame 11. The computer case frame 11 has a guiding hole 111. Next to the guiding hole 111 there is a horizontal guiding slit 1111 and a sideways bracing 1112. Two bracing holes 112 each formed respectively above and below the guiding slit 1111.

Figure 4:
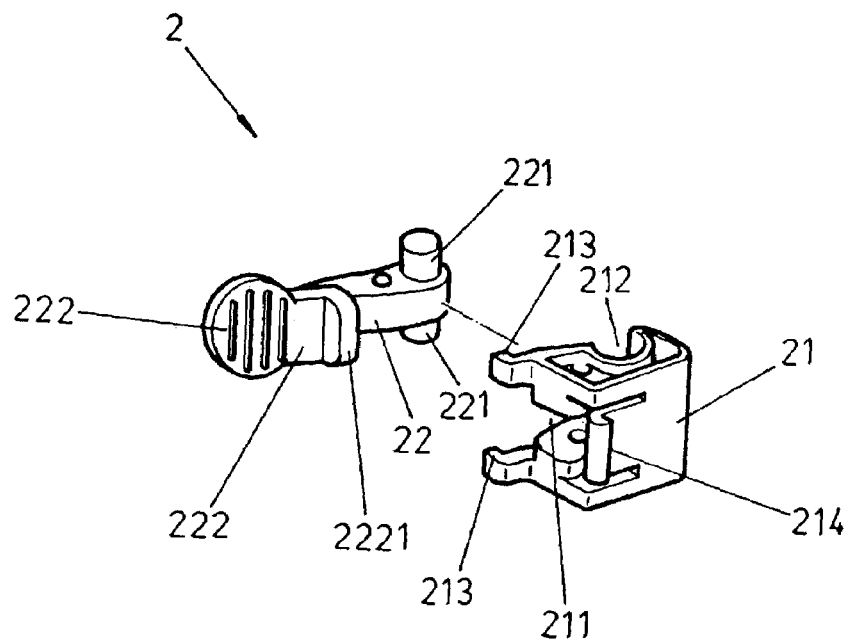
FIG. 4 is a detailed exploded drawing of the fastening mechanism according to the present invention.

Referring to FIG. 4, the clamp 2 comprises a clamp socket 21 and a clamping piece 22. The rear end of the clamping piece 22 fits into a central slit 211 on the clamp socket 21. The upper and lower end of the clamp socket 21 comprises a rounded axle socket 212. The rounded axles 221 disposed on the upper and lower sides at the rear end of the clamping piece 22 fit into the axle socket 212, thus securing the position of the clamping piece 22 on the clamp socket 21. A pushing piece 222 having a pressure piece 2221 is disposed at the other end of the clamping piece 22. The pushing piece 222 fits into the guiding hole 111 of the computer case frame 11, thus securing its position in the guiding slit 1111. On the front end of the clamp socket 21 there is an upper and a lower fastening hook 213. These fastening hooks 213 fit into the bracing holes 112 on the computer case frame 11. On the back side of the clamp socket 21 there is a backward hook 214, which fits into the sideways bracing 1112 of the computer case frame 11.

Figure 6:
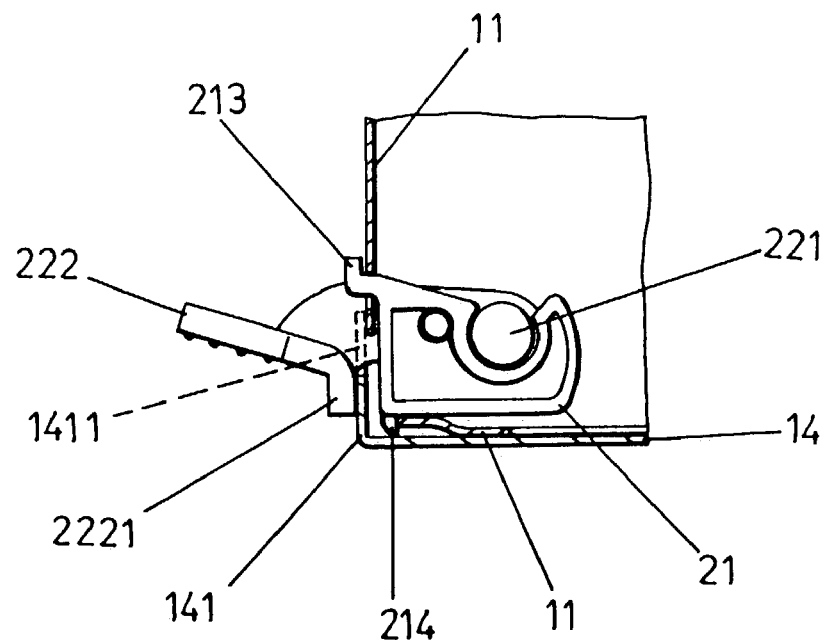
FIG. 6 is a partial sectional top plan view showing the computer case with installed fastening mechanism (with closed clamp) according to the present invention.
Figure 5:
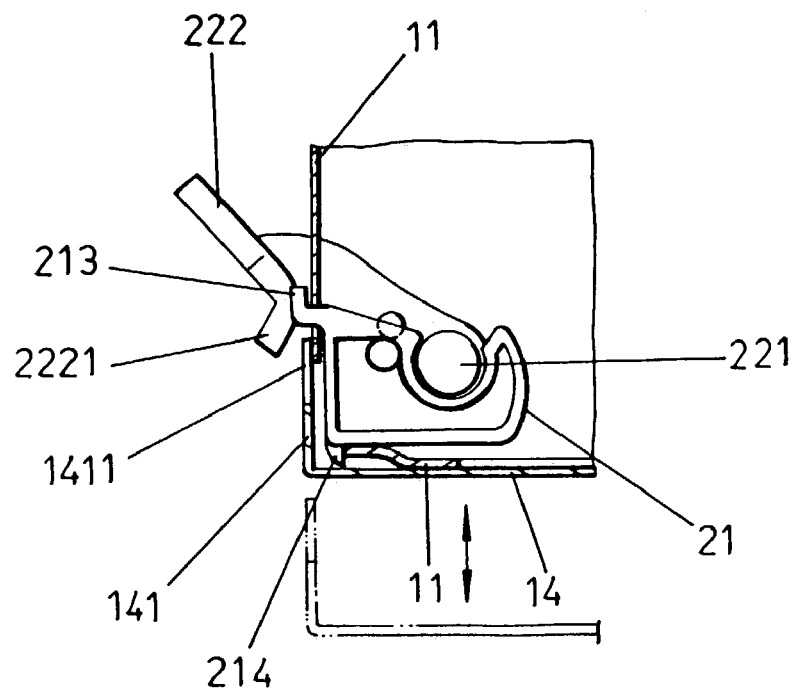
FIG. 5 is a partial sectional top plan view showing the computer case with installed fastening mechanism (with opened clamp) according to present invention.

Referring to FIG. 5, the side covers 14 have to be mounted onto the computer case frame 11. First, a C-shaped hole 1411 at a bend edge 141 of the side cover 14 has shown no connection yet to the clamp 2, such that both side covers 14 mounted onto the computer case frame 11 is accordingly shown without fastening the clamps 2. Then, as shown in FIG. 6, when the user pushes the pushing piece 222 of the clamping piece 22, thus forcing the clamping piece 22 to pivotally turn with the axle socket 212. This results in the clamping piece 22 being pushed into the C-shaped hole 1411 at the bend edge 141 of the side cover 14. The pressure piece 2221 on the other end of the pushing piece 222 will exert pressure to the bend edge 141 of the side cover 14, thereby securing the side cover 14 fast and easy.

As the above description shows, the present invention relates to a clamp fastener, which enables the user to fasten the two side covers fast and easily to the computer case frame, thus reducing the time and labor needed for assembly or maintenance, further improving the commercial value of the present structure.

It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. An assembly comprising:
   a) a frame having a plurality of guiding holes, each guiding hole including a horizontal guiding slit, a sideways bracing and a pair of bracing holes above and below the guiding slit;
   b) a side cover mountable onto the frame, the side cover including a bent edge having a C-shaped hole;
   c) a clamp including a clamping piece and a clamp socket,
      i. the clamping piece including a pair of rounded axles, disposed on upper and lower sides at a rear end thereof, a pushing piece on a front end thereof and a pressure piece on a side thereof, and ii. the clamp socket including a central slit for receiving the clamping piece, a pair of rounded axle sockets on upper and lower ends of the central slit for receiving the pair of rounded axles, upper and lower fastening hooks formed on a front side thereof for engaging the bracing holes, and a backward hook on a backside thereof for engaging the sideways bracing; and d) wherein after the clamp is mounted to the frame and the side cover is positioned onto the frame, pushing the pushing piece causes the clamping piece to pivot about axle sockets and engage within the C-shaped hole, thereby causing the pressure piece to exert pressure to the bent edge of the side cover and secure the side cover to the frame.

* * * * *